(12) United States Patent
Taddiken et al.

(10) Patent No.: US 11,217,453 B2
(45) Date of Patent: Jan. 4, 2022

(54) METHODS AND DEVICES RELATED TO RADIO FREQUENCY DEVICES

(71) Applicant: Infineon Technologies Dresden GmbH & Co. KG, Dresden (DE)

(72) Inventors: Hans Taddiken, Munich (DE); Christian Butschkow, Munich (DE); Andrea Cattaneo, Taufkirchen (DE); Henning Feick, Dresden (DE); Dominik Heiss, Munich (DE); Christoph Kadow, Gauting (DE); Uwe Seidel, Munich (DE); Valentyn Solomko, Munich (DE); Anton Steltenpohl, Munich (DE)

(73) Assignee: INFINEON TECHNOLOGIES DRESDEN GMBH & CO. KG, Dresden (DE)

( * ) Notice: Subject to any disclaimer, the term of this patent is extended or adjusted under 35 U.S.C. 154(b) by 0 days.

(21) Appl. No.: 16/903,588

(22) Filed: Jun. 17, 2020

(65) Prior Publication Data

US 2021/0043497 A1  Feb. 11, 2021

(30) Foreign Application Priority Data

Aug. 8, 2019 (EP) .................................... 19190666

(51) Int. Cl.
*H01L 21/3065* (2006.01)
*H01L 21/265* (2006.01)
(Continued)

(52) U.S. Cl.
CPC .. *H01L 21/30655* (2013.01); *H01L 21/02016* (2013.01); *H01L 21/26506* (2013.01); *H01L 21/3226* (2013.01); *H01L 21/76* (2013.01); *H01L 21/76264* (2013.01); *H01L 23/3171* (2013.01); *H01L 23/58* (2013.01);
(Continued)

(58) Field of Classification Search
CPC ............... H01L 21/76; H01L 21/26506; H01L 21/30655; H01L 21/3226; H01L 21/76264; H01L 23/3171; H01L 23/58; H01L 27/08; H01L 27/1203; H01L 23/291; H01L 21/02016; H01L 21/02019; H01L 21/042;
(Continued)

(56) References Cited

U.S. PATENT DOCUMENTS

2012/0049691 A1\* 3/2012 Kando .................. H01L 41/253
310/313 C
2014/0291723 A1\* 10/2014 Miyazaki ............ H01L 29/1004
257/139

(Continued)

OTHER PUBLICATIONS

Fang, Z.-Q., et al., "Plasma-etching-enchanced deep centers in n-GaN grown by metalorganic chemical-vapor deposition". Applied Physics Letters, vol. 82, No. 10, Mar. 10, 2003, 4 pages.

*Primary Examiner* — Eduardo A Rodela
(74) *Attorney, Agent, or Firm* — Slater Matsil, LLP

(57) ABSTRACT

A method includes providing a semiconductor substrate having a first side and a second side opposite to the first side, forming at least one radio frequency device at the first side; thinning the semiconductor substrate from the second side; and processing the second side of the thinned semiconductor substrate to reduce leakage currents or to improve a radio frequency linearity of the at least one radio frequency device.

12 Claims, 13 Drawing Sheets

(51) Int. Cl.
    *H01L 21/322*     (2006.01)
    *H01L 21/76*     (2006.01)
    *H01L 21/762*     (2006.01)
    *H01L 23/31*     (2006.01)
    *H01L 23/58*     (2006.01)
    *H01L 27/08*     (2006.01)
    *H01L 27/12*     (2006.01)
    *H01L 21/02*     (2006.01)
    *H01L 23/29*     (2006.01)

(52) U.S. Cl.
    CPC .......... *H01L 27/08* (2013.01); *H01L 27/1203* (2013.01); *H01L 23/291* (2013.01)

(58) Field of Classification Search
    CPC ... H01L 21/46; H01L 21/0475; H01L 21/461; H01L 21/322; H01L 21/38; H01L 21/302
    See application file for complete search history.

(56) References Cited

U.S. PATENT DOCUMENTS

| | | | | |
|---|---|---|---|---|
| 2015/0028453 A1* | 1/2015 | Kim | ................ | H01L 21/823892 |
| | | | | 257/607 |
| 2015/0311279 A1* | 10/2015 | Onozawa | .......... | H01L 29/66348 |
| | | | | 257/139 |
| 2017/0062284 A1 | 3/2017 | Mason et al. | | |
| 2019/0371891 A1* | 12/2019 | Goktepeli | ......... | H01L 21/30625 |
| 2021/0050344 A1* | 2/2021 | Hosoya | ............ | H01L 29/66128 |
| 2021/0074551 A1* | 3/2021 | Cheng | ............... | H01L 21/02002 |

\* cited by examiner

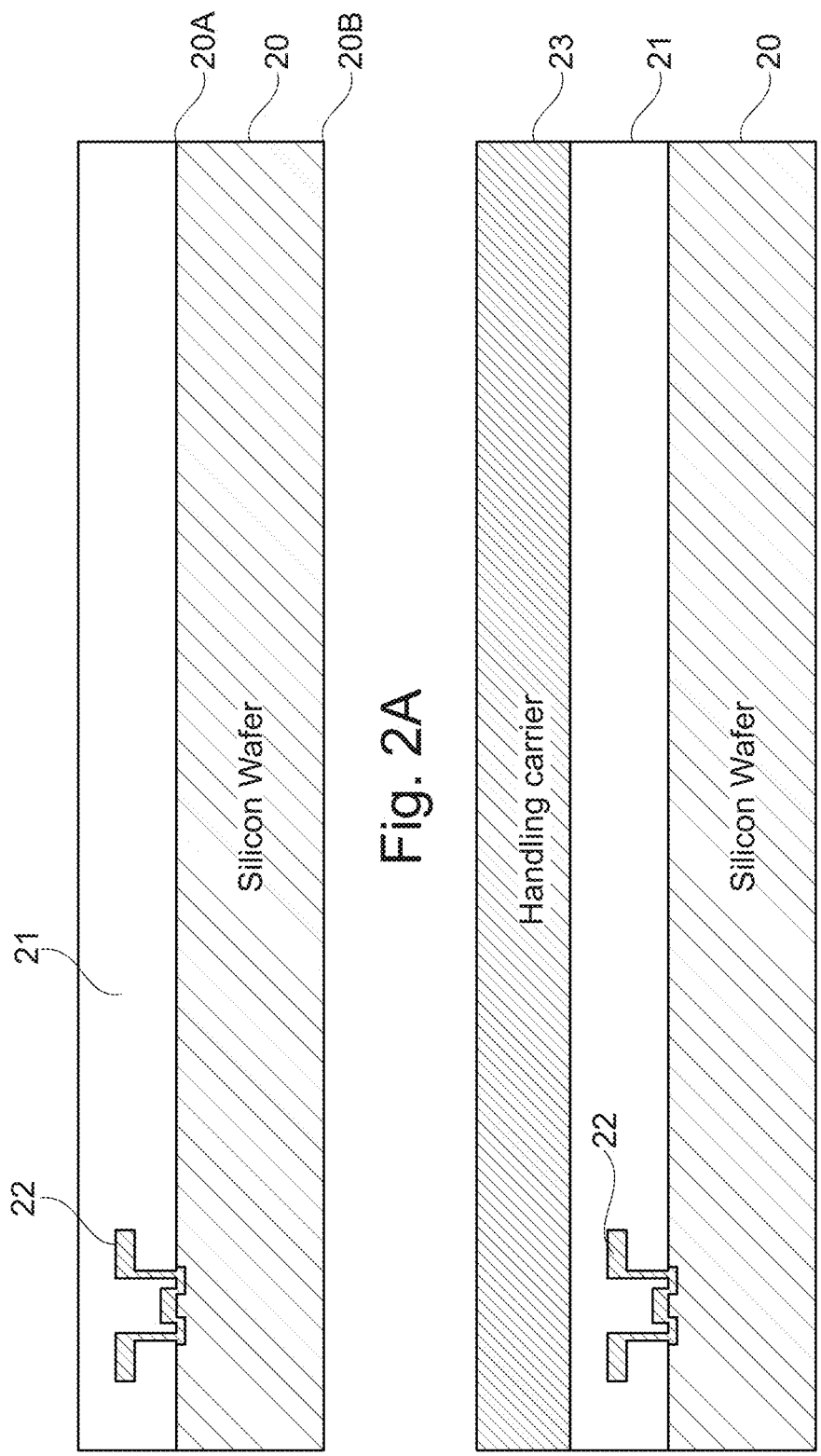

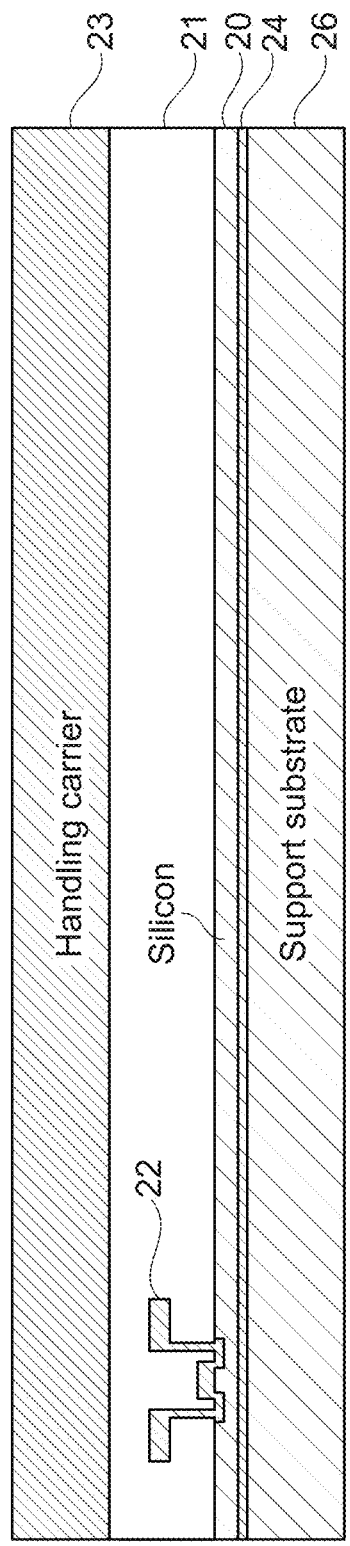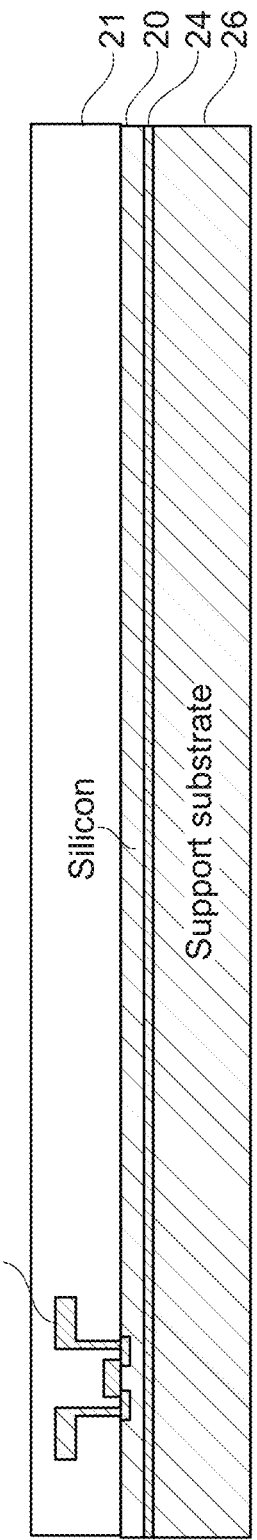

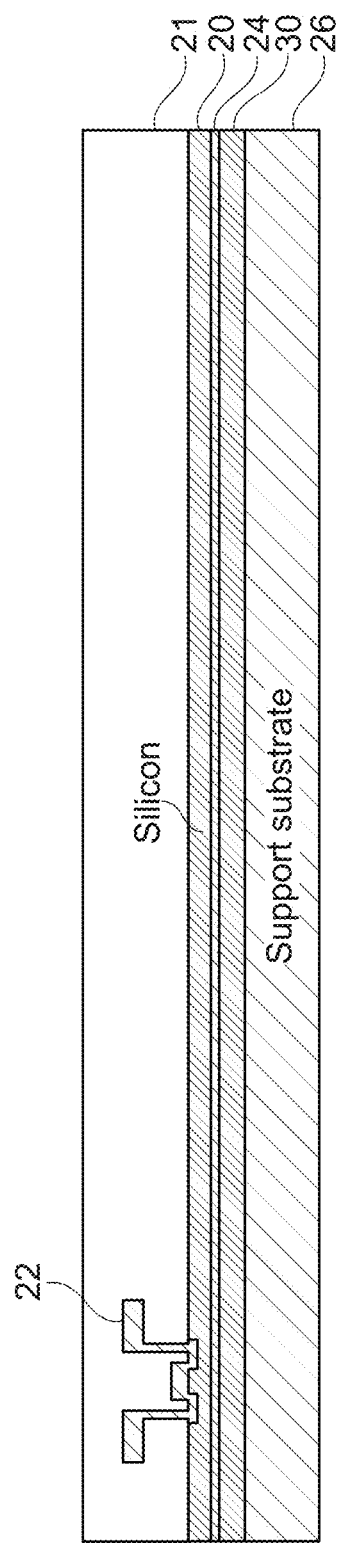

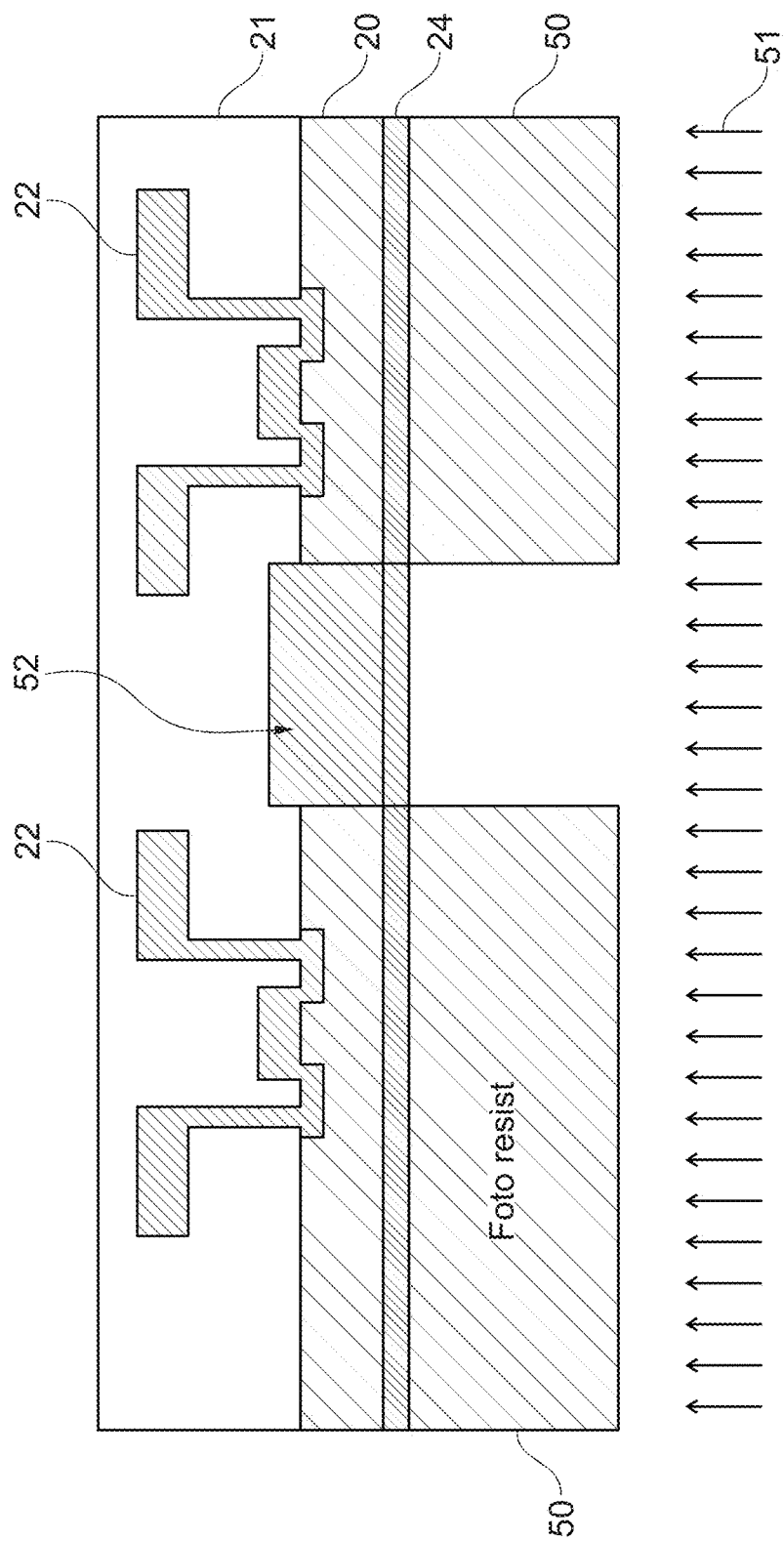

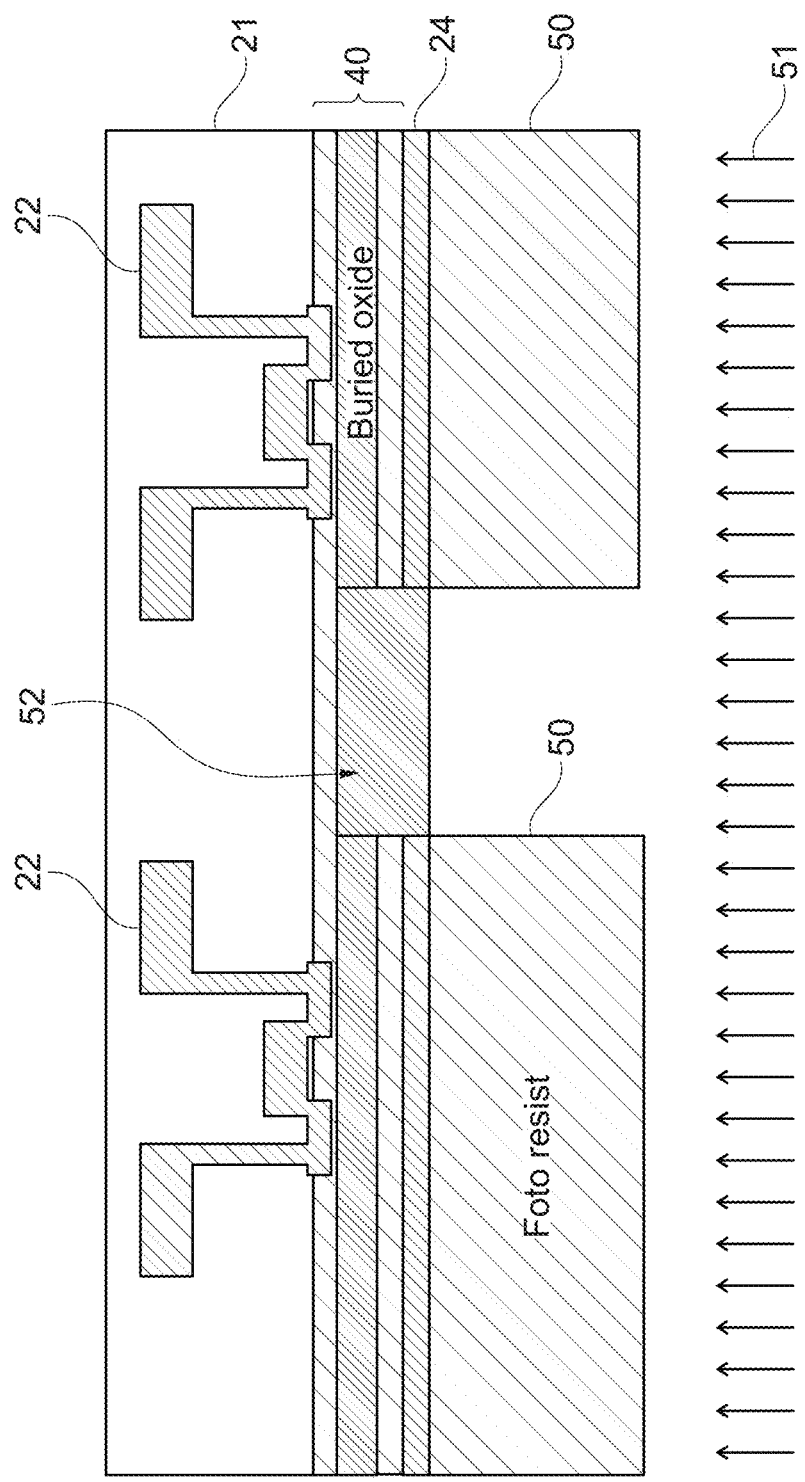

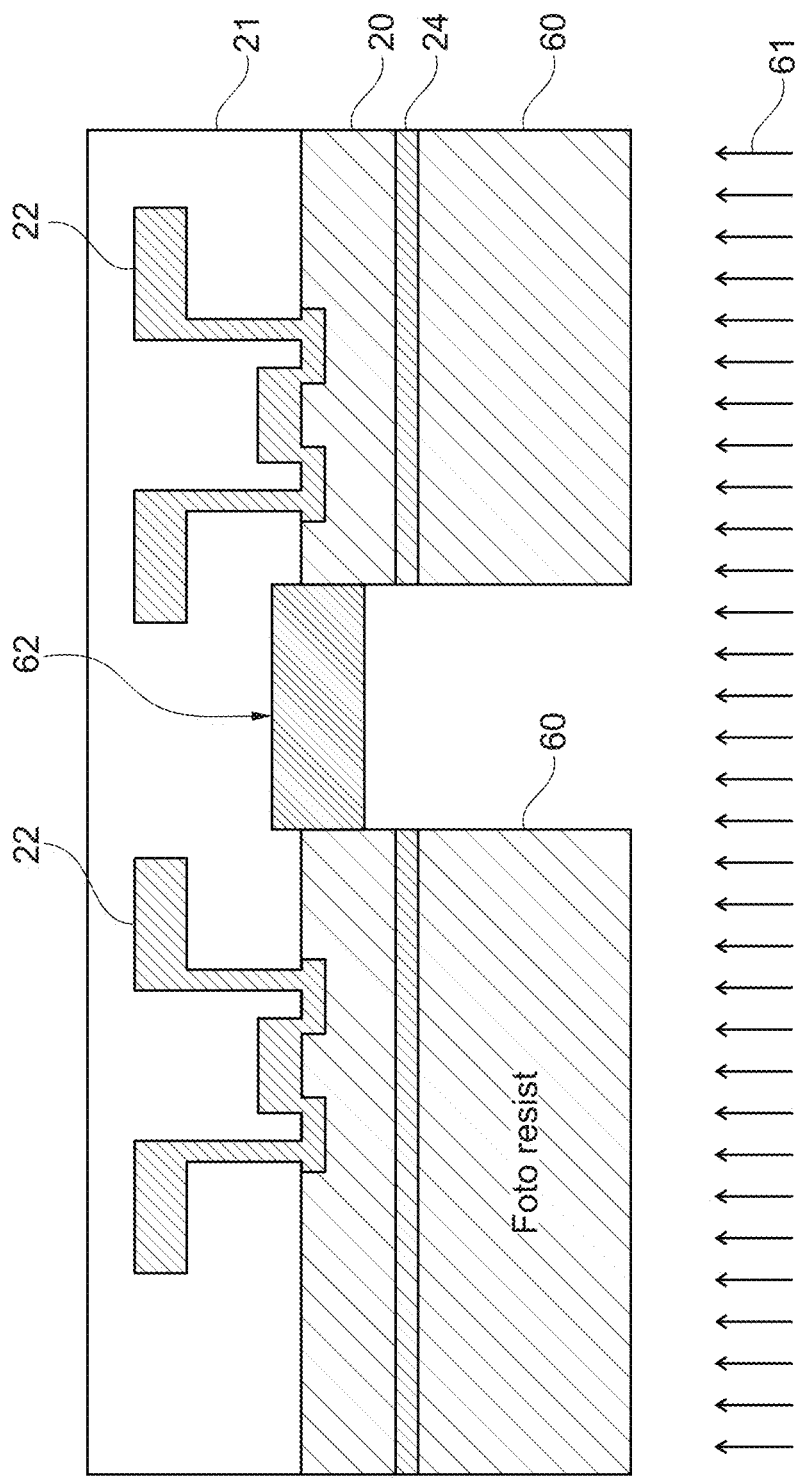

METHODS AND DEVICES RELATED TO RADIO FREQUENCY DEVICES

This application claims the benefit of European Patent Application No. 19190666, filed on Aug. 8, 2019, which application is hereby incorporated herein by reference.

TECHNICAL FIELD

The present application relates to methods for manufacturing a device including one or more radio frequency devices and to corresponding devices.

BACKGROUND

Radio frequency devices are for example used in communication circuits. Examples for radio frequency devices are transistor-based radio frequency switches, which in some implementations may be formed by coupling a plurality of transistors in series. Radio frequency, as used herein, may relate to frequencies above 100 kHz, in particular in the Megahertz range or Gigahertz range. For example, for the upcoming 5G (5th Generation) mobile communication standard frequencies of up to 300 GHz will be used.

For such radio frequency devices, specification requirements are becoming more and more strict. For example, a reduced insertion loss and an improved linearity may be required.

SUMMARY

A method as defined in claim 1 and a device as defined in claim 15 are provided. The dependent claims define further embodiments.

According to an embodiment, a method is provided, comprising:
  providing a semiconductor substrate having a first side and a second side opposite the first side,
  forming at least one radio frequency device at the first side, for example on and/or in the first side,
  thinning the semiconductor substrate from the second side, and
  processing the second side of the thinned semiconductor substrate to reduce leakage currents or to improve a radio frequency linearity of the at least one radio frequency device.

According to another embodiment, a device is provided, comprising:
  a semiconductor substrate having a first side and a second side opposite the first side, wherein a thickness of the semiconductor substrate is 70 µm or less,
  at least one radio frequency device formed at the first side of the semiconductor substrate; and
  a processed region at the second side of the semiconductor substrate, wherein the processed region comprises one or more of:
    an ion implanted layer;
    a defect rich layer;
    a doped layer with a dopant concentration higher than in a region adjacent to the doped layer;
    an aluminum oxide layer; or
    an etched region.

The above summary is merely intended to give a brief overview of some embodiments and is not to be construed as limiting in any way, as other embodiments may comprise other features than the ones explicitly mentioned above.

BRIEF DESCRIPTION OF THE DRAWINGS

FIGS. 2A to 2F are cross-sectional views of a device according to an embodiment in various stages of processing;

FIGS. 3, 4, 5A, 5B, 6A to 6C are cross-sectional views of devices in various stages of processing according to further embodiments;

DETAILED DESCRIPTION OF ILLUSTRATIVE EMBODIMENTS

In the following, various embodiments will be described in detail referring to the attached drawings. It is to be understood that these embodiments are given for illustrative purposes and are not to be construed as limiting in any way. For example, while embodiments may be described as comprising a plurality of features, elements, process steps and the like, in other embodiments, some of these features, elements or process steps may be omitted or replaced by alternative features, elements or process steps. In addition to the features, elements or process steps explicitly shown and described, other features, elements or process steps may be provided, for example, features, elements or process steps used in conventional radio frequency devices and manufacturing thereof.

Figure 1:
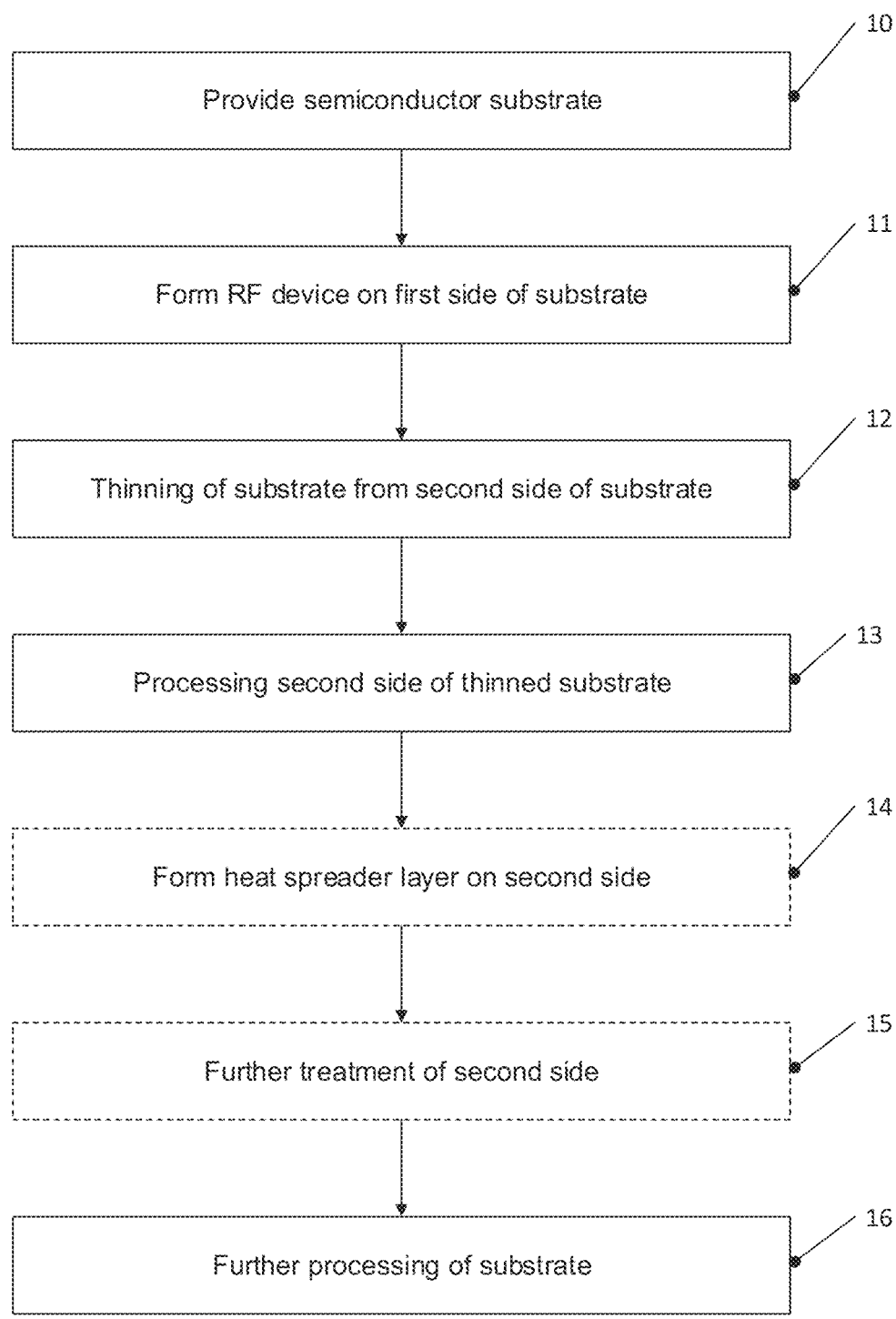
FIG. 1 is a flowchart illustrating a method according to an embodiment.

FIG. 1 shows a method for manufacturing a device according to some embodiments. For better understanding, the method of FIG. 1 will be described referring to FIGS. 2A to 2F, which show a device in various stages of processing in an example implementation of a method of FIG. 1, referring to FIGS. 3 to 6 (FIG. 5 comprising FIGS. 5A and 5B and FIG. 6 comprising FIGS. 6A to 6C) for explaining variations and optional parts of the method, and referring to FIGS. 7 to 9, which are used to explain various effects which may be obtained in some implementations. Nevertheless, it should be noted that the method of FIG. 1 and the devices shown in FIGS. 2 to 6 may also be implemented independently from each other, and the joint description merely serves to provide a better understanding.

At 10, the method of FIG. 1 comprises providing a semiconductor substrate. For example, the substrate may be a complete semiconductor wafer. As an example, in FIG. 2A a silicon wafer 20 is provided as a substrate. In other implementations, other semiconductor wafers, for example wafers based on III-V semiconductors like gallium arsenide, may be used.

The semiconductor substrate has a first side and a second side opposite the first side. As an example, in FIG. 2A, silicon wafer 20 has a first side 20A and a second side 20B.

At 11, the method comprises forming a radio frequency (RF) device at the first side of the substrate. "At" the first side means that the RF device may be formed in the first side of the substrate, may be formed on the first side of the substrate by depositing one or more layers on the substrate and processing these layers, or both. Any conventional techniques like ion implantation, photolithography, etching, metal deposition, oxide deposition, semiconductor layer deposition etc. may be used to form the RF device. "An RF device" in the sense used herein may refer to one or more devices, or may refer to devices comprising a plurality of different components. For example, an RF switch may be formed as a series connection of a plurality of RF transistors. As an example, in FIG. 2A, an active RF device 22 is formed in the first side 20A of silicon wafer 20 and in a device layer 21 on the first side 20A. In the example of FIG. 2A, device 22 is a field effect transistor. In other embodiments, other devices, both active and passive, may be formed.

To facilitate subsequent processing, the silicon wafer may then be mounted to a handling carrier at the first side. For example, a glass carrier may be used, to which the silicon wafer is mounted using for example an adhesive. This is shown as an example in FIG. 2B, where the silicon wafer 20 (together with device 22 and layer 21) is mounted to a handling carrier 23 at its first side.

Figure 2C:
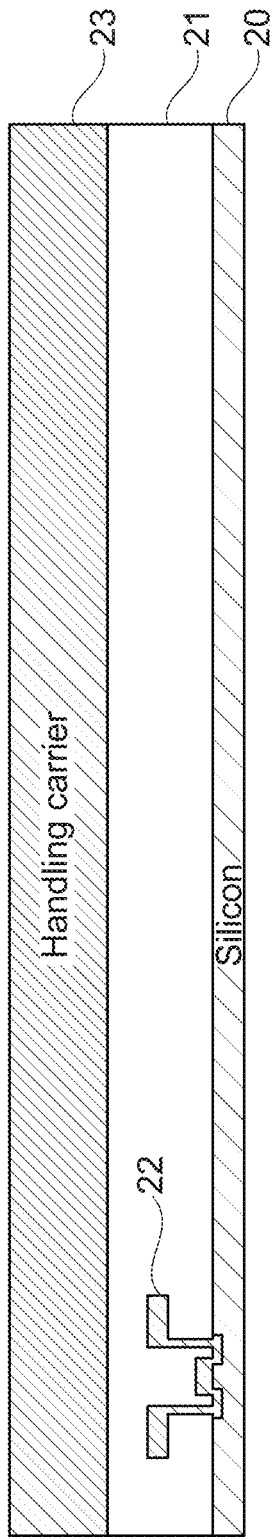

Next, in FIG. 1 at 12, the method comprises a thinning of the substrate from the second side of the substrate. For thinning the substrate, any suitable techniques may be used like mechanical grinding or chemical-mechanical polishing (CMP). A thickness of the substrate after the thinning may be between 5 and 70 μm, for example about 25 μm. An example is shown in FIG. 2C, where substrate 20 is thinned from the second side to 20B (see FIG. 2A), i.e. from the side opposite the side where active device 22 is formed.

In some implementations, thinning the substrate generates defects at the second side of the silicon substrate, which may adversely affect operation of the RF device formed at the first side, for example due to leakage currents, free carriers or increased conductivity. In the embodiment of FIG. 1, to mitigate such adverse effects, the second side of the thinned substrate is processed at 13 to form a processed region at the second side. In embodiments, the processed region may extend essentially over the complete second side, e.g. over at least 80% or at least 90% of the second side.

Figure 2D:
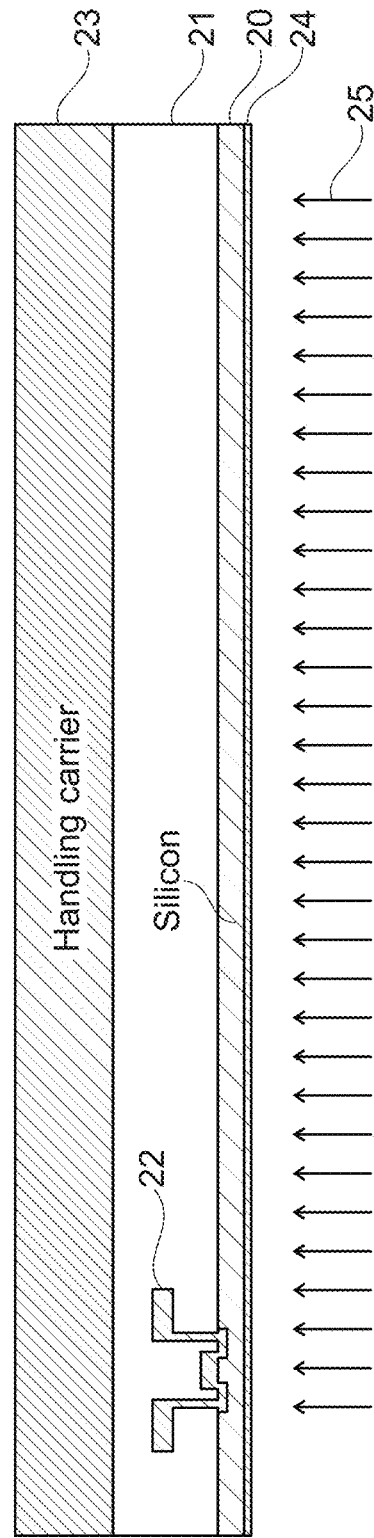

An example is shown in FIG. 2D, where an ion implantation is performed as indicated by arrows 25 to form a processed region 24. Generally, the processed region may be formed in silicon substrate 20 by modifying a region of silicon substrate 20 on the second side (for example by the above-mentioned ion implantation), or may be formed by depositing one or more additional layers on the second side of substrate 20.

Various possibilities for this processing at 13 exist. In some embodiments, the processing forms (deep) defects at the second side. This may for example be effected by ion implantation with appropriate doses and energies or by some kinds of etching treatments like reactive ion etching, for example Bosch etching. In particular, in this way, deep defects at or near the middle of the bandgap of the semiconductor material (silicon in the example of FIG. 2D) may be formed, which pin the Fermi level at or near the middle of the bandgap. In other embodiments, the defect levels generated may also be distributed nearly continuously over the bandgap, so that the Fermi level is approximately located in the middle of the bandgap. This sets shallow defects formed by the thinning, i.e. defects with energy levels near the bandgap, to a defined state and mitigates adverse effects of these shallow defects. In some embodiments, this may lead to a reduction of charge carriers and therefore to a high ohmic behavior of the substrate at the second side.

In other embodiments, the processed region may be a doped region to generate charge carriers, for example an n-doped region or a p-doped region. For example, a doped region may be formed by ion implantation (for example by implanting phosphorous or arsenic in silicon for n-type doping or boron for p-type doping) or by depositing a doped layer. In other embodiments, a layer like an aluminum oxide layer may be deposited on the second side. The effects of the thinning at 12 in FIG. 1 and of the processing at 13 in FIG. 1 in some implementations will now be explained referring to FIGS. 7 to 9.

In some embodiments, the processed region may serve to reduce an electric field at or near the second side.

Figure 7:
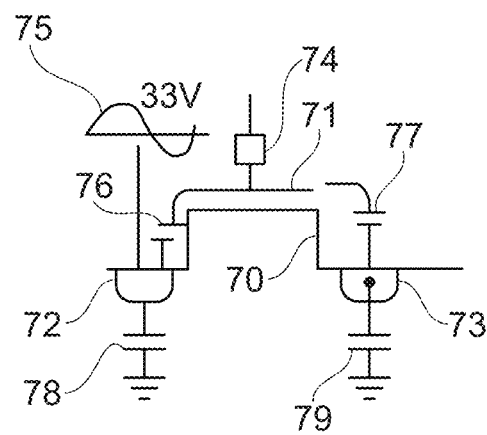
FIGS. 7 to 9 are diagrams for explaining effects of some embodiments.

FIG. 7 shows a field effect transistor 70 as an example for an RF device used for the following explanations. In FIG. 7, field effect transistor 70 is shown as including a drain region 72 formed in the substrate (for example silicon wafer 20), a source region 73 formed in the substrate and a gate electrode 71. Gate electrode 71 is coupled to a gate resistor 74. Transistor 70 is controlled by applying a gate-source voltage, as known in the art. To form an RF switch as mentioned above, a plurality of such transistors may be coupled in series. The plurality of transistors is also referred to as transistor stack in the following. For example, about 30 transistors may be coupled in series. In operation, then an RF signal 75 is applied to the transistors. Typical source-drain voltages in such an application may be in the range of 1 to 3 V per transistor, or, in other words, an amplitude of RF signal 75 applied to each transistor may be of the order of 1 to 3 V. This voltage essentially corresponds to an overall voltage applied to the series of transistors divided by the number of transistors.

When implementing transistor 70 as shown in FIG. 7, various parasitic capacitances are formed depending on the implementation. As examples, in FIG. 7 a drain-gate capacitance 76, a gate-source capacitance 77, a drain-substrate capacitance 78 and a source-substrate capacitance 79 are shown. These capacitances may cause an uneven distribution of the overall voltage over the transistors resulting in a higher voltage drop over a last transistor of the transistor stack. This last transistor has a certain breakdown voltage. Applying higher voltages will cause first breakdown of this last transistor when the voltage drop over the last transistor exceeds its breakdown voltage, and subsequently result in a breakdown of the whole transistor stack. Finally, the transistor stack may hold a lower total maximum RF-Voltage amplitude than for an ideal voltage distribution. This is illustrated in FIG. 8.

Figure 8:
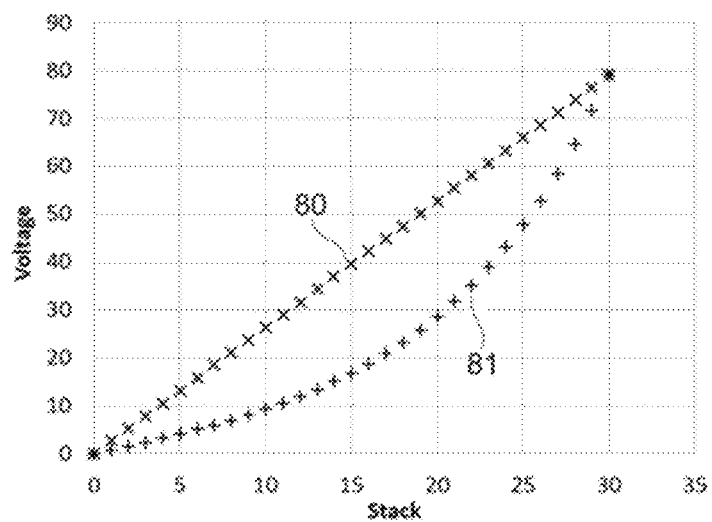

FIG. 8 illustrates the voltage drop U over a number of transistors n of a transistor stack. In an ideal case, as represented by a curve 80, the RF-voltage over the stacked transistors is homogenously distributed, i.e. with each "added" transistor the voltage drop U increases by the same amount ΔU. In practice, through the capacitances illustrated with respect to FIG. 7 or other effects, in particular substrate capacitances 78, 79, an inhomogeneous voltage distribution is introduced as represented by curve 81. This inhomogeneous voltage distribution on the other hand requires the transistors to be built to tolerate greater voltages, as over some transistors a higher voltage drop than in the homogenous case occurs.

Figure 9:
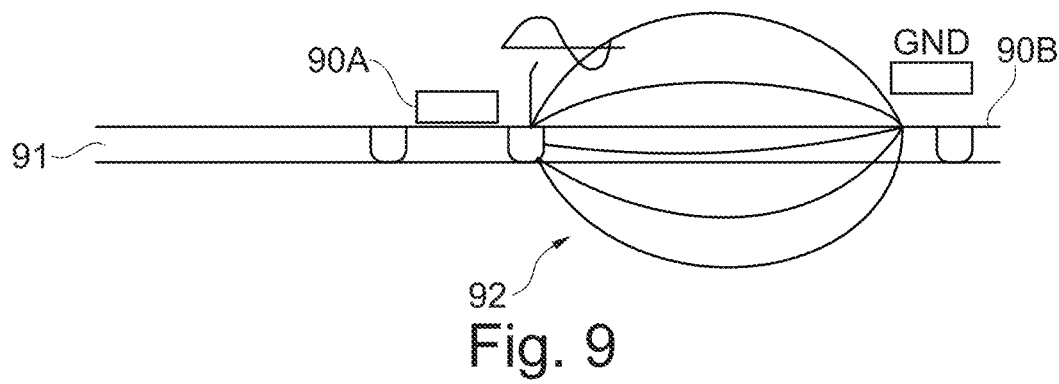

By thinning the substrate, the inhomogeneous voltage distribution may be reduced. The inhomogeneous voltage distribution is at least in part caused by substrate capacitances 78, 79. FIG. 9 illustrates a transistor 90A and a substrate contact 90B formed on a thinned substrate 91. The transistor 90A may be implemented as explained for transistor 70 of FIG. 7. Transistor 90A may be part of a series connection of a higher number of transistors, e.g. a transistor stack, for example about 30 transistors, as explained above.

In operation, field lines 92 occur, which for a thinned substrate are to a great extent outside the substrate, reducing the capacitances 78, 79. Semiconductor materials like silicon have a comparatively high dielectric constant, for example approximately 12 for silicon. By thinning the substrate, or by replacing it with a carrier substrate with lower dielectric constants as will be further explained further below, the capacitances 78, 79 may be reduced, and therefore the inhomogeneous voltage distribution may be reduced in some implementations. However, as mentioned, through the thinning leakage currents are increased, for example by defects caused by the thinning. Such defects at the second side of the substrate may lead to an increased leakage current which results in an unwanted higher current consumption of the whole chip. The defects may also result in a higher nonlinear behavior. By the processing at 13 in FIG. 1, explained with reference to FIG. 2D, these leakage currents may be significantly reduced in some embodiments, thus improving device performance and mitigating adverse effects of the thinning.

Returning to FIG. 1, at 14 the method optionally comprises forming a heat spreader layer on the second side. A heat spreader layer is a layer with a thermal conductivity sufficient to disperse heat generated in operation by the RF device. A thickness of the heat spreader layer may be between 1 and 10 μm, but is not limited thereto. Suitable materials include aluminum nitride (AlN), aluminum oxide (Al2O3), sapphire, silicon carbide (SiC), carbon or diamond like layers, for example a diamond like coating or diamond like carbon. The heat spreader layer in some embodiments may, in addition to its heat spreading functions, also prevent a diffusion of unwanted ions from outside the device to active regions, in particular regions where the RF devices are formed. As an example, a heat spreader layer 30 is illustrated in FIG. 3 provided on the processed region 24.

Also optionally, at 15, the method of FIG. 1 may include a further treatment of the second side. It should be noted that the heat spreader layer at 14, if provided, may also be formed after this further treatment. Such a further treatment may include an ion implantation and/or etching between different devices.

An example for such a selective ion implantation is indicated by arrows 51 in FIG. 5A. Here, two RF devices 22 are shown. Photoresist 50 is provided and structured to form a mask for the ion implantation, such that an implanted region 52 is formed only between devices 22. Implanted region 52 may extend through the complete substrate 20 and reach layers of devices 22. Ions used for the ion implantation may comprise helium (He), hydrogen (H) or argon (Ar) ions. By this ion implantation, charge carrier lifetime in the implanted area 52 may be reduced, which increases DC (direct current) isolation between devices 22 and/or may enhance radio frequency performance of passive devices like coils or couplers.

Additionally or alternatively, the further treatment at 15 may include thinning the oxide between devices. This is shown in FIG. 6A, where on the one hand, the already explained ion implantation indicated by arrow 61 is performed, here using a photoresist 60 and forming an implanted area 62 corresponding essentially to area 52 of FIG. 5. Additionally, an etching of the silicon is performed, such that the silicon of silicon wafer 20 is thinned between devices 22. In some embodiments, reactive ion etching (RIE) may be used for this thinning.

Returning to FIG. 1, at 16 the method may comprise further processing of the substrate. In embodiments, the further processing may comprise mounting a support substrate to the semiconductor substrate. An example is shown in FIG. 2F, where a support substrate 26 is mounted to the substrate. The support substrate may be made of a material having a lower dielectric constant than silicon (see explanations above regarding FIG. 9). In embodiments, a material having a good heat conductivity may be selected for the support substrate, like aluminum nitride, aluminum oxide, sapphire or silicon carbide, for example in embodiments where no heat spreading layer is provided. In other embodiments, a glass substrate may be used. In some embodiments, the dielectric constant of the supporting substrate may be below 8, for example about 4 in case of glass. Furthermore, at 16 the handling carrier 23, if provided, is removed in embodiments. The support substrate may be mounted to the substrate using adhesive bonding techniques like a BCB-layer and/or SU-8 layer or using a glue layer.

Figure 6B:
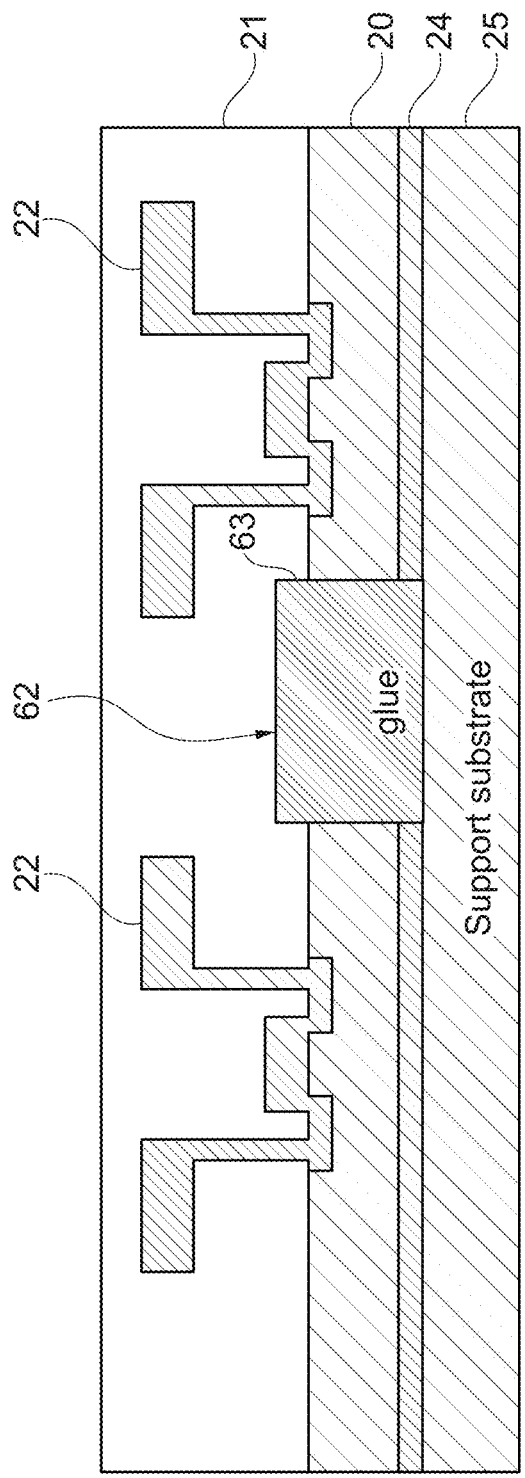
Figure 6C:
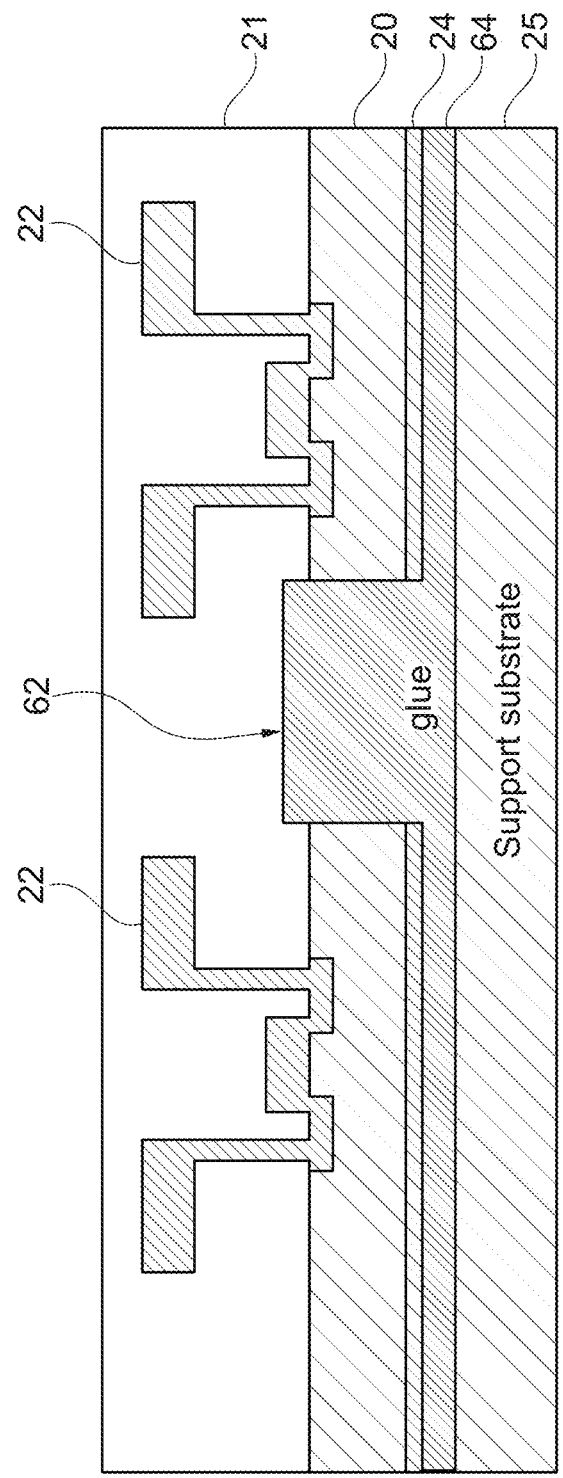

For example, in embodiments where at 15 an additional etching is performed, a glue may be used to fill the space thus created when mounting the support substrate to the semiconductor substrate. An example is illustrated in FIG. 6B, where glue 63 is provided filling these pores. The glue may also extend in a layer to also provide a bonding between substrate 20 and support substrate 25, as shown for a glue layer 64 in FIG. 6C.

Other processing at 16 may include conventional semiconductor device processing like testing, dicing or packaging, which is also used in conventional device manufacturing processes and will therefore not be described in further detail here.

Figure 4:
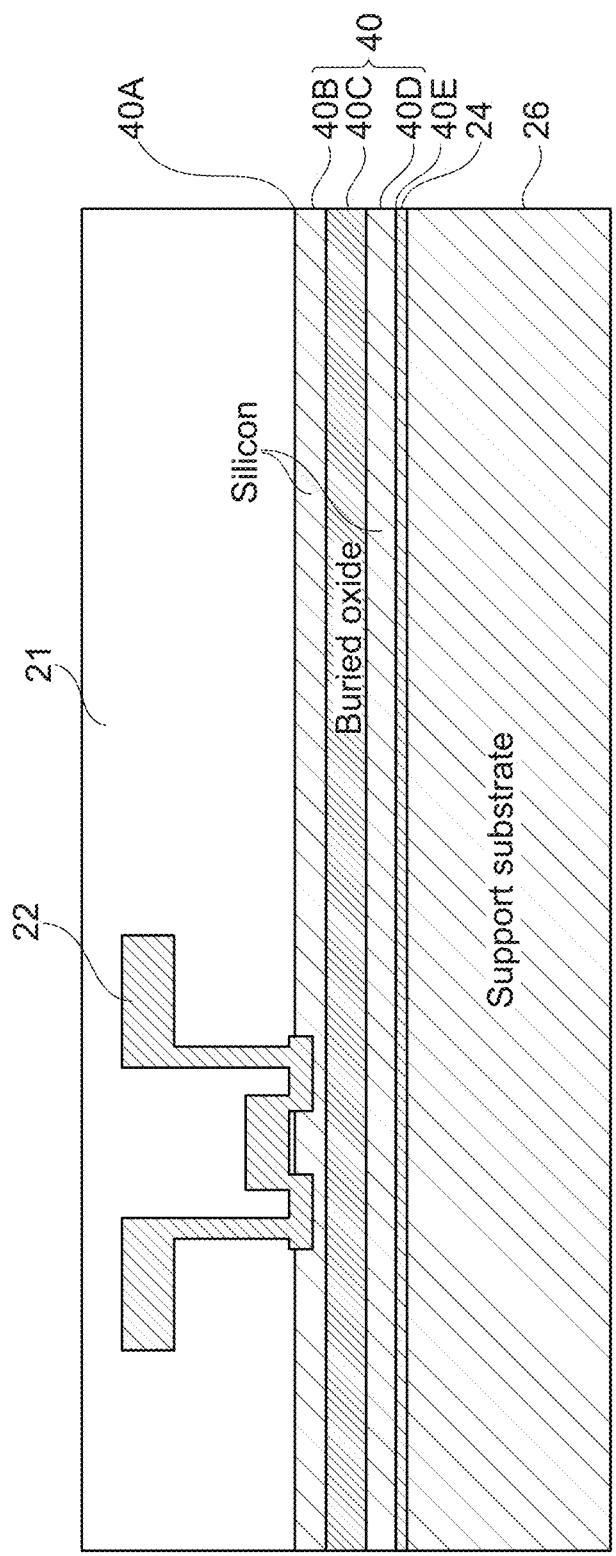

In the above examples, in particular in the devices shown in FIGS. 2A to 2F, a simple semiconductor wafer like a simple silicon wafer is used as a semiconductor substrate. In other embodiments, a substrate with a buried insulating layer may be used as semiconductor substrate, notably a silicon on insulator (SOI) wafer. The processing for such substrates essentially is as explained above. To give an example, FIG. 4 illustrates a device according to an embodiment which essentially corresponds to the representation of FIG. 2F, where instead of silicon wafer 20 a silicon on insulator wafer 40 is used which includes a top silicon layer 40B at a first side 40A where device 22 is formed, a bottom silicon layer 40D at a second side 40E and a buried oxide layer 40C between silicon layers 40B, 40D. The thinning at 12 of FIG. 1 is performed by thinning bottom silicon layer 40D. Unlike some conventional approaches where silicon layer 40D is completely removed, in embodiments, silicon layer 40D remains to a certain thickness, for example a thickness between 5 μm and 70 μm.

Processed region 24 is then formed at bottom silicon layer 40D. In some embodiments, silicon layer 40D then serves as heat spreader layer, but also an additional heat spreader layer as explained above (see 14 in FIG. 1) may be provided. Otherwise, the processing when using a semiconductor substrate with a buried isolating layer like an SOI substrate may be performed as explained referring to FIG. 1, including the variations described above.

For example, an additional ion implantation between devices may be performed, which may extend through the buried oxide. An example is shown in FIG. 5B, which, apart from the fact that an implanted layer 52 is formed between devices 22 which may extend through a buried oxide is formed in SOI wafer 40, corresponds to FIG. 5A. Likewise, an additional removal of material, for example by etching as explained with reference to FIG. 6A may also be performed with such wafers. Variations may also be combined.

Figure 11:
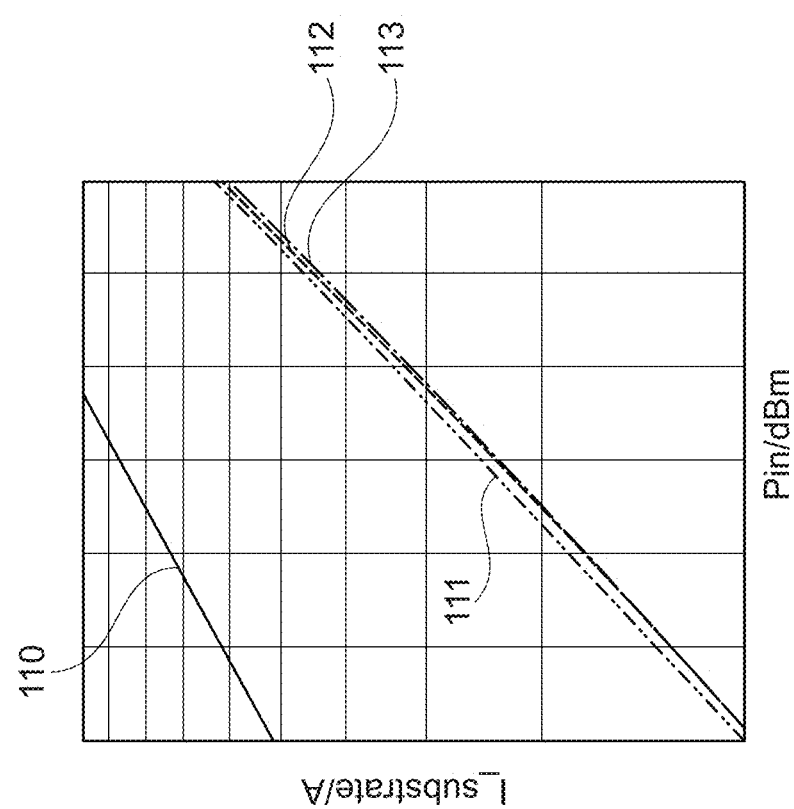
FIGS. 10 and 11 show a comparison of properties of devices according to embodiments with conventional devices.
Figure 10:
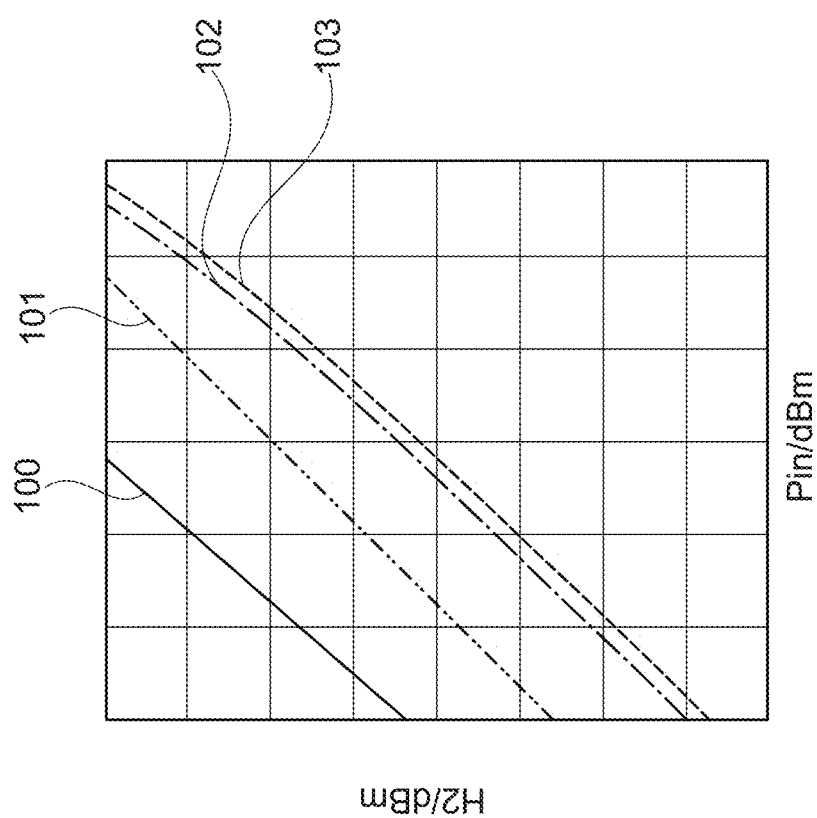

To illustrate the effects of some embodiments, in particular the processing at 13 in FIG. 1, FIGS. 10 and 11 show best performance results for some wafers. FIG. 10 illustrates the second harmonic H2 in dBm over power Pin also in dBm.

A curve 100 shows a result for a thinned silicon wafer (thinning at 12) without the processing at 13. A curve 101 shows the result for processing at 13 by boron implantation, a curve 102 shows the result for argon implantation, and a curve 103 shows a result for Bosch etching of the second side. As can be seen, by various kinds of processing second harmonic generation is reduced, thus increasing linearity.

In FIG. 11, a substrate current I_substrate in Ampere (A) is plotted over the power Pin. The substrate current essentially corresponds to an unwanted increase of the total current consumption of the chip. A curve no shows the result for thinning without processing (thinning at 12 without processing at 13 in FIG. 1), a curve 111 shows processing by boron implantation into the second side, a curve 112 shows the result for processing by argon implantation, and a curve 113 shows the result for Bosch etching as processing at 13. As can be seen, the currents are significantly reduced by the various kinds of processing. It should be noted that the curves in FIGS. 10 and 11 are merely examples for specific implementations, and curves and results may vary depending on devices, processing and materials used.

Various embodiments are defined by the following examples:

Example 1. A method, comprising:
providing a semiconductor substrate having a first side and a second side opposite to the first side,
forming at least one radio frequency device at the first side;
thinning the semiconductor substrate from the second side; and
processing the second side of the thinned semiconductor substrate to reduce leakage currents or to improve a radio frequency linearity of the at least one radio frequency device.

Example 2. The method of example 1, wherein processing the second side of the thinned semiconductor substrate to reduce leakage currents or to improve a radio frequency linearity comprises reducing the density of free charge carriers at the second side of the thinned semiconductor substrate.

Example 3. The method of example 1 or 2, wherein processing the second side of the thinned semiconductor substrate to reduce leakage currents or to improve a radio frequency linearity comprises providing charge carriers at the second side of the thinned semiconductor substrate.

Example 4. The method of example 3, wherein providing charge carriers comprises introducing a dopant in the second side of the thinned semiconductor substrate.

Example 5. The method of example 3 or 4, wherein providing carriers comprises forming a doped layer on the second side of the thinned semiconductor substrate.

Example 6. The method of any one of examples 1 to 5, wherein processing the second side of the thinned semiconductor substrate to reduce leakage currents or to improve a radio frequency linearity comprises introducing defects at the second side of the semiconductor substrate.

Example 7. The method of any one of examples 1 to 6, wherein processing the second side of the thinned semiconductor substrate to reduce leakage currents or to improve a radio frequency linearity comprises implanting ions into the second side of the thinned semiconductor substrate.

Example 8. The method of example 7, wherein the ions comprise at least one ion from the group consisting of argon ions and boron ions.

Example 9. The method of any one of examples 1 to 8, wherein processing the second side of the thinned semiconductor substrate to reduce leakage currents or to improve a radio frequency linearity additionally provides ion gettering at the second side of the thinned semiconductor substrate.

Example 10. The method of any one of examples 1 to 9, wherein processing the second side of the thinned semiconductor substrate to reduce leakage currents or to improve a radio frequency linearity comprises performing a Bosch etching.

Example 11. The method of any one of examples 1 to 10, wherein processing the second side of the thinned semiconductor substrate to reduce leakage currents or to improve a radio frequency linearity comprises forming an aluminum oxide layer on the second side of the thinned semiconductor substrate.

Example 12. The method of any one of examples 1 to 11, further comprising forming a heat spreading layer on the second side of the thinned semiconductor substrate.

Example 13. The method of any one of examples 1 to 12, wherein forming at least one radio frequency device comprises forming at least two radio frequency devices, wherein the method further comprises:
performing at least one of an ion implantation or an etching from the second side of the thinned semiconductor substrate limited to an area between the at least two radio frequency devices.

Example 14. The method of example 13, wherein the ion implantation extends into a device layer on the first side of the thinned semiconductor substrate.

Example 15. The method of any one of examples 1 to 14, wherein thinning the semiconductor substrate from the second side comprises thinning the semiconductor substrate to a thickness between 5 μm and 75 μm.

Example 16. The method of any one of examples 1 to 15, wherein the semiconductor substrate comprises a first semiconductor layer on the first side, a second semiconductor layer on the second side and an insulating layer between the first semiconductor layer and the second semiconductor layer, wherein processing the second side of the thinned semiconductor substrate to improve a radio frequency linearity comprises processing the thinned second semiconductor layer.

Example 17. The method of example 16, wherein the thinned second semiconductor layer has a thickness between 5 μm and 70 μm.

Example 18. The method of any one of examples 1 to 17, further comprising mounting a support substrate at the second side.

Example 19. A device, comprising:
a semiconductor substrate having a first side and a second side opposite the first side, wherein a thickness of the semiconductor substrate is 70 μm or less,
at least one radio frequency device formed at the first side of the semiconductor substrate; and
a processed region at the second side of the semiconductor substrate, wherein the processed region comprises one or more of:
an ion implanted layer;
a defect rich layer;
a doped layer with a dopant concentration higher than in a region adjacent to the doped layer;
an aluminum oxide layer; and
a reactive ion etched region.

Example 20. The device of example 19, wherein the processed region is configured to additionally provide ion gettering at the second side of the semiconductor substrate.

Example 21. The device of example 19 or 20, further comprising a heat spreading layer on the second side of the semiconductor substrate.

Example 22. The device of any one of examples 19 to 21, wherein the at least one radio frequency device comprises at least two radio frequency devices, wherein the device further comprises:
at least one of an ion implanted region or an etched region from the second side of the semiconductor substrate limited to an area between the at least two radio frequency devices.

Example 23. The device of example 22, wherein the ion implanted region extends into a device layer on the first side of the semiconductor substrate.

Example 24. The device of any one of examples 19 to 23, wherein the semiconductor substrate comprises a first semiconductor layer on the first side, a second semiconductor layer on the second side and an insulating layer between the first semiconductor layer and the second semiconductor layer, wherein a thickness of the second semiconductor layer is between 5 µm and 7 µm.

Example 25. The device of any one of examples 19 to 24, further comprising a support substrate mounted at the second side.

Example 26. The device of any one of examples 19 to 25, wherein the processed region is adapted to pin a Fermi level at or near the middle of a bandgap of the semiconductor substrate, e.g. within 0.1 or 0.2 eV around the middle of the bandgap.

Example 27. The device of any one of examples 19 to 26, wherein the reactive ion etched region is a Bosch etched region.

Example 28. The device of any one of examples 19 to 27, wherein the processed region essentially extends over the whole second side of the semiconductor substrate, e.g. over at least 80% or at least 90% of the second side.

Example 29. The device of any one of examples 19 to 28, wherein the processed layer is configured to reduce the density of free charge carriers at the second side of the thinned semiconductor substrate.

Example 30. The device of any one of examples 19 to 29, manufactured by the method of any one of examples 1 to 18.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method, comprising:
providing a semiconductor substrate having a first side and a second side opposite to the first side,
forming at least one radio frequency device at the first side;
thinning the semiconductor substrate from the second side; and
processing the second side of the thinned semiconductor substrate to reduce leakage currents or to improve a radio frequency linearity of the at least one radio frequency device, wherein processing the second side of the thinned semiconductor substrate to reduce leakage currents or to improve a radio frequency linearity comprises performing a Bosch etching.

2. The method of claim 1, wherein processing the second side of the thinned semiconductor substrate to reduce leakage currents or to improve a radio frequency linearity comprises reducing a density of free charge carriers at the second side of the thinned semiconductor substrate.

3. The method of claim 1, wherein processing the second side of the thinned semiconductor substrate to reduce leakage currents or to improve a radio frequency linearity comprises providing charge carriers at the second side of the thinned semiconductor substrate.

4. The method of claim 3, wherein providing charge carriers comprises introducing a dopant in the second side of the thinned semiconductor substrate.

5. The method of claim 3, wherein providing carriers comprises forming a doped layer on the second side of the thinned semiconductor substrate.

6. The method of claim 1, wherein processing the second side of the thinned semiconductor substrate to reduce leakage currents or to improve a radio frequency linearity comprises introducing defects at the second side of the semiconductor substrate.

7. The method of claim 1, wherein processing the second side of the thinned semiconductor substrate to reduce leakage currents or to improve a radio frequency linearity additionally provides ion gettering at the second side of the thinned semiconductor substrate.

8. The method of claim 1, further comprising forming a heat spreading layer on the second side of the thinned semiconductor substrate.

9. A method, comprising:
providing a semiconductor substrate having a first side and a second side opposite to the first side,
forming at least one radio frequency device at the first side;
thinning the semiconductor substrate from the second side;
processing the second side of the thinned semiconductor substrate to reduce leakage currents or to improve a radio frequency linearity of the at least one radio frequency device, comprising ion implantation or Bosch etching; and
forming an aluminum oxide layer on the second side of the thinned semiconductor substrate.

10. A method, comprising:
providing a semiconductor substrate having a first side and a second side opposite to the first side,
forming at least two radio frequency devices at the first side;
thinning the semiconductor substrate from the second side; and
processing the second side of the thinned semiconductor substrate to reduce leakage currents or to improve a radio frequency linearity of the at least two radio frequency devices, comprising performing at least one of a ion implantation or an etching from the second side of the thinned semiconductor substrate limited to an area between the at least two radio frequency devices.

11. The method of claim 10, wherein the ion implantation extends into a device layer on the first side of the thinned semiconductor substrate.

12. A method, comprising:
providing a semiconductor substrate having a first side and a second side opposite to the first side,
forming at least one radio frequency device at the first side;
thinning the semiconductor substrate from the second side; and processing the second side of the thinned semiconductor substrate to reduce leakage currents or to improve a radio frequency linearity of the at least one radio frequency device, wherein the semiconductor substrate comprises a first semiconductor layer on the first side, a second semiconductor layer on the second side and an insulating layer between the first semiconductor layer and the second semiconductor layer, wherein processing the second side of the thinned semiconductor substrate to reduce leakage currents or to improve a radio frequency linearity comprises processing the thinned second semiconductor layer using ion implantation or Bosch etching.

\* \* \* \* \*